United States Patent [19]

Härtl et al.

[11] Patent Number: 4,639,556
[45] Date of Patent: Jan. 27, 1987

[54] HEARING AID WITH A FLEXIBLE PRINTED CIRCUIT BOARD

[75] Inventors: Christof Härtl, Neunkirchen; Hans Wagner, Buckenhof, both of Fed. Rep. of Germany

[73] Assignee: Siemens Aktiengesellschaft, Berlin and Munich, Fed. Rep. of Germany

[21] Appl. No.: 650,387

[22] Filed: Sep. 14, 1984

[30] Foreign Application Priority Data

Oct. 5, 1983 [DE] Fed. Rep. of Germany ....... 3336266

[51] Int. Cl.$^4$ ...................... H04R 25/02; H04R 25/00
[52] U.S. Cl. ...................................... 381/68.6; 381/69
[58] Field of Search ........ 179/107 R, 107 E, 107 FD; 381/68, 69

[56] References Cited

U.S. PATENT DOCUMENTS

| | | | |
|---|---|---|---|
| 3,598,928 | 8/1971 | Hickox | 179/107 E |
| 4,354,065 | 10/1982 | Buettner | 179/107 H |
| 4,395,601 | 7/1983 | Köpke et al. | 179/107 R |

FOREIGN PATENT DOCUMENTS

| | | |
|---|---|---|
| 1088561 | 9/1960 | Fed. Rep. of Germany . |
| 2721469 | 11/1978 | Fed. Rep. of Germany . |
| 2016862 | 9/1979 | United Kingdom . |
| 2070890 | 9/1981 | United Kingdom . |

OTHER PUBLICATIONS

Hearing Instruments, Feb. 1983, vol. 34, No. 2, 4 page article entitled, "Flexible Circuitry, Leadless Components and Vapor Phase Soldering", by Longwell et al.

Primary Examiner—Gene Z. Rubinson
Assistant Examiner—Danita R. Byrd
Attorney, Agent, or Firm—Mark H. Jay

[57] ABSTRACT

A flexible printed circuit is attached to the housing of a hearing aid by at least one user-operated control element. The printed circuit further has a bending zone which is devoid of components, and component zones on which components are mounted.

6 Claims, 3 Drawing Figures

HEARING AID WITH A FLEXIBLE PRINTED CIRCUIT BOARD

BACKGROUND OF THE INVENTION

The invention relates to hearing aids and apparatus for use therein, particularly hearing aids of the type which are introduced into the outer auditory canal. Hearing aids of this type are advantageously as small and lightweight as possible.

To facilitate such miniaturization, flexible printed circuits have been used. For example, a flexible foil printed circuit has been used to connect the terminals of the speaker microphone and battery inside a hearing aid, with the actual circuit elements being centrally located and the terminals bent into the cavity of the unit.

It would be advantageous to provide hearing aid apparatus that would make it easier to miniaturize a hearing aid of the above-referenced type. Thus, one object of the invention is to provide a hearing aid of this type which can be further miniaturized. Another object is to provide such a hearing aid which can be manufactured in a cost-effective manner. A further object is to generally improve on known devices of this type.

SUMMARY OF THE INVENTION

In accordance with the invention, a hearing aid has a flexible printed circuit which is partitioned into three zones: a support zone, a component zone and a bending zone. The bending zone is devoid of electrical components; these are located in the component zone. The bending zone separates the component zone and the support zone.

The printed circuit is attached to the housing (preferably at its end plate) of the hearing aid at the support zone, and is fastened in position by control elements (such as a volume control) which can be operated from the outside by operating handles (such as a knob). The printed circuit is then bent at the bending zone so that the component zone extends into the center of the hearing aid. In this way, the end plate of the housing only needs to be large enough to support the user-operatred control elements and the components can be located where there is enough room for them. When this construction is utilized, the space inside the housing can be used more efficiently, and the hearing aid may thus be further miniaturized.

Advantageously, the component zone conforms with the shape of the battery so that the battery is not overlapped. In this fashion, there is additional room for the components.

The invention will be better understood with reference to the drawings and the detailed description of the preferred embodiments which follow.

DETAILED DESCRIPTION OF PREFERRED EMBODIMENTS

Figure 1:
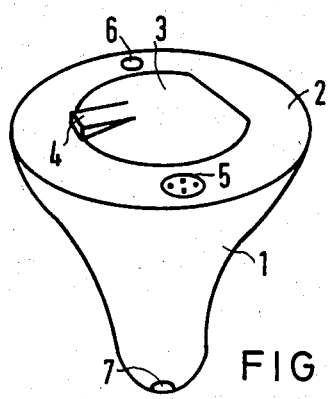
FIG. 1 is a perspective drawing of a hearing aid in accordance with the invention.

FIG. 1 illustrates a housing 1, made in this example of plastic, of a hearing aid of the type which is introduced into the outer auditory canal (not shown) of a user. The interior of the housing 1 is closed off in this example by an end plate 2 with a cover 3. The cover 3 can be pivoted out of the end plate 2 by means of a lug 4 and carries on its inner side (with the aid of a lug 4 visible in FIG. 2) a battery (not shown). On the outer side of the end plate 2 a control element 5 is provided. In this example, control element 5 is a volume control, but another control element 5 could be used. An example of another control element 5 is a network for establishing the desired frequency transmission characteristics of the hearing aid. Further a sound receiving port 6 and a sound transmitting port 7 are visible.

Figure 2:
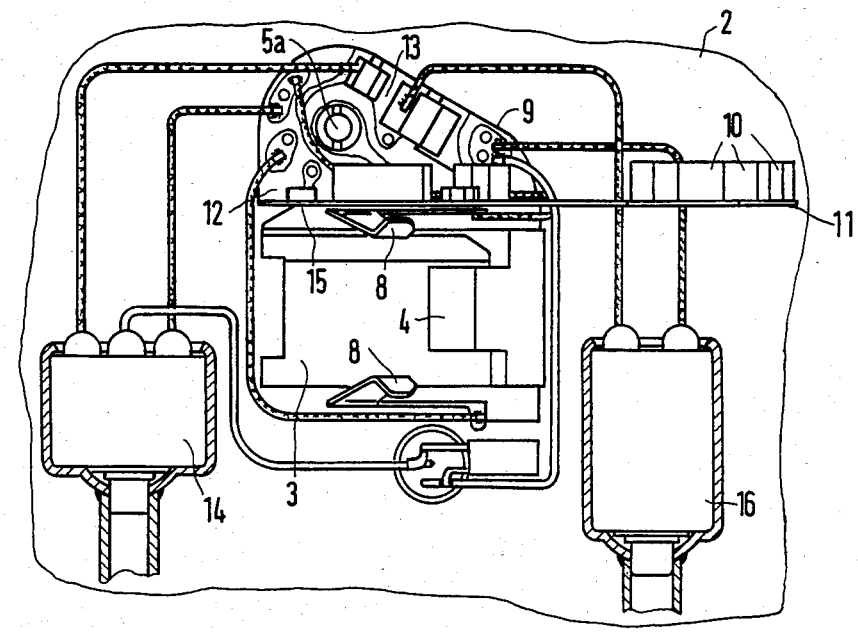
FIG. 2 shows an internal view of the end plate of a hearing aid in accordance with the invention.

FIG. 2 shows the back of the end plate 2. Next to the cover 3 two springs 8 can be seen, between which the battery (not shown) may be clamped. The electrical components 10 are connected by means of a flexible foil printed circuit 9. Circuit 9 has a component zone 11 which contains the components 10. Components 10 are preferably of the leadless type and are preferably connected by vapor phase soldering. Circuit 9 also has a bending zone 12 which is devoid of components. Circuit 9 also has a support zone 13, where the circuit 9 is fastened to the inner side of the end plate 2 by user operated control elements. The support zone 13 is also a component zone, in that it is provided with components, as is shown in FIG. 2. In this example, the control element is a potentiometer 5a, which is adjustable by a knob 5.

Figure 3:
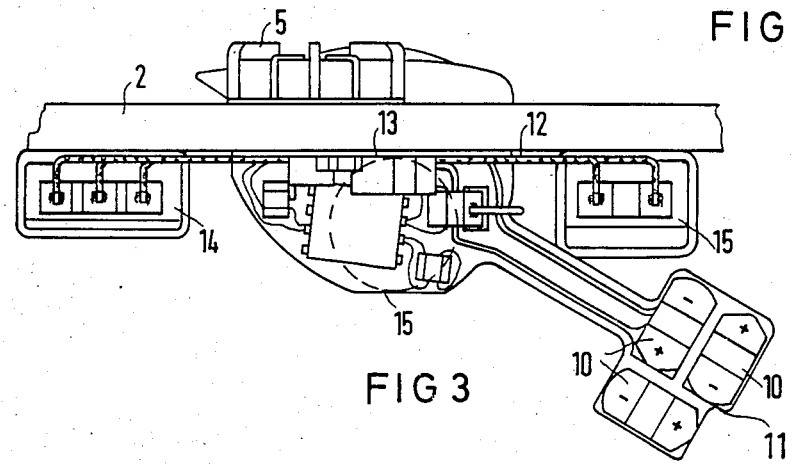
FIG. 3 is a sectional view of the end plate of a hearing aid in accordance with the invention.

The circuit 9 in this example further possesses another component zone 15 projecting from the inner side of the end plate 2 into the interior of the housing 1, with additional components which are visible in particular in FIG. 3. The form of this component zone 15, which extends for instance at right angles to the end plate 2, corresponds to the contour of the battery, and does not project over it. The component zone 15 is connected to the component zone 11 through an elongated zone which is devoid of electrical components.

In FIGS. 2 and 3, which are on a larger scale than FIG. 1, are further visible a microphone 14 and a loudspeaker 16, which are connected with the circuit 9 by means of flexible wires and are disposed in suitable manner in the interior of the housing 1. In particular the inlet and outlet openings of the microphone 14 and of the receiver 16 are connected by means of flexible tubes 6a and 7a with the openings 6 and 7, respectively.

It is evident from FIGS. 2 and 3 that the flexible foil circuit 9 with the components 10 arranged on it optimally utilizes the cavity of the hearing aid. This is possible because the component zone 11 can be oriented such that it lies in a suitable region in the interior of the hearing aid. In this way, accordingly, it is possible to accommodate all components even if the dimensions of the hearing aid are very small. The depth of the hearing aid is utilized optimally, so that also small ears can be fitted advantageously.

Those skilled in the art will understand that changes can be made in the preferred embodiments here described, and that these embodiments can be used for other purposes. Such changes and uses are within the scope of the invention, which is limited only by the claims which follow.

What is claimed is:

1. A hearing aid for insertion into a user's outer auditory canal, comprising:
   a housing including an end plate;
   a flexible printed circuit comprising component zones to which electrical components are mounted and bending zones which are devoid of electrical components; and
   a user-operated control element located on the end plate of the housing and fastening the circuit to the end plate inside the housing.

2. The hearing aid of claim 1, wherein one of the component zones is a support zone at which the circuit is fastened to the end plate.

3. A hearing aid for insertion into a user's outer auditory canal, comprising:
   a housing including an end plate and having an interior;
   a flexible printed circuit having (a) a support zone which is fastened to the inner side of the end plate by a user operated control element, (b) a further portion having electrical components, and (c) a bending zone between the support zone and the further portion, whereby said further portion extends at an angle to said support zone and projects from the support zone into the interior of the housing.

4. A hearing aid according to claim 3, wherein said further portion projects from the support zone at a right angle.

5. A hearing aid according to claim 3, further comprising a cover carrying a battery on its inner side, wherein said further portion is located with respect to the battery in a manner that the further portion fails to project over the battery secured to the cover.

6. A hearing aid according to claim 3, wherein the flexible printed circuit further comprises another zone containing electrical components, said zone being connected with said further portion through a zone which is devoid of electrical components.

* * * * *